United States Patent [19]

Bynum

[11] Patent Number: 4,703,455
[45] Date of Patent: Oct. 27, 1987

[54] BIPOLAR PROGRAMMABLE MEMORY AND METHOD

[75] Inventor: Byron G. Bynum, Tempe, Ariz.

[73] Assignee: Motorola, Inc., Schaumburg, Ill.

[21] Appl. No.: 812,659

[22] Filed: Dec. 23, 1985

[51] Int. Cl.[4] ............................................ G11C 11/40
[52] U.S. Cl. .................................... 365/174; 365/104; 365/184; 365/210
[58] Field of Search ................. 365/174, 94, 104, 189, 365/184, 210

[56] References Cited

U.S. PATENT DOCUMENTS

| 4,064,493 | 12/1977 | Davis | 365/96 |
| 4,094,008 | 6/1978 | Lockwood et al. | 365/210 |
| 4,158,239 | 6/1979 | Bertin | 365/174 |

Primary Examiner—Terrell W. Fears
Attorney, Agent, or Firm—Michael D. Bingham

[57] ABSTRACT

A non-volatile bipolar memory using the technique of comparing selectively degraded bipolar transistor's betas or base-to-emitter voltages to a non-degraded transistor's beta or base-to-emitter voltage to generate desired logic output states from the memory.

11 Claims, 3 Drawing Figures

BIPOLAR PROGRAMMABLE MEMORY AND METHOD

BACKGROUND OF THE INVENTION

The present invention relates to programmable non-volatile memories in general and, more particularly, to a non-volatile, bipolar memory and method for producing desired logic outputs therefrom.

Programmable non-volatile bipolar memory cells, such as Read Only Memories (ROM's), Programmable Read Only Memories (PROM's) and such are well known in the industry. For example, the MCM7684 is a bipolar PROM manufactured by Motorola, Inc.

Typically, programming of such memories to generate selectively programmed logic outputs require metal fuze links to be blown and/or Zener zapping programming methods as understood which require relatively high currents (200-600 milliamperes). Thus, complicated schemes for programming large arrays of memory cells are required, if at all possible. Moreover, such large current programming currents eliminate the possibility of in-package programming of a large array of integrated memory cells.

Thus, a need exists for providing one-time, low current selective programming of bipolar memory cells.

SUMMARY OF THE INVENTION

Accordingly, it is an object of the present invention to provide an improved bipolar memory and method.

Another object of the present invention is to provide low current programming of bipolar memory cells.

Still another object of the present invention is to provide a programmable memory cell using selected degraded bipolar transistors that are compared to a reference transistor.

In accordance with the above and other objects there is provided a bipolar memory cell using one of many circuit structures in which the beta or base-emitter voltage of a selectively degraded transistor is compared to that of a non-degraded reference transistor.

DETAILED DESCRIPTION OF THE PREFERRED EMBODIMENTS

Figure 1:
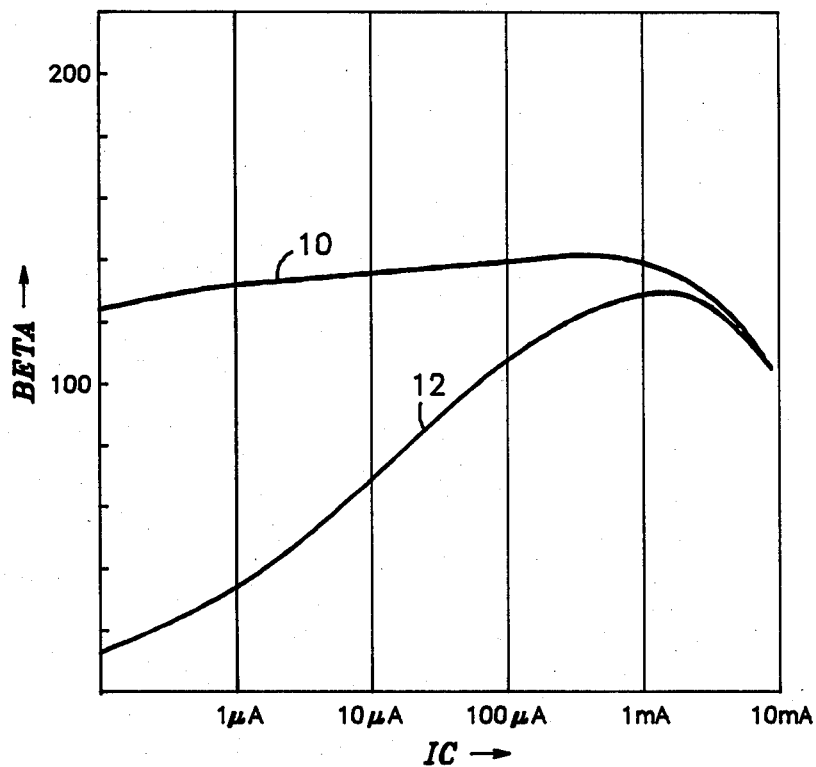
FIG. 1 is a graph illustrating the low current gain characteristics versus collector current of a transistor before and after it has been degraded as taught by the present invention.

Turning now to FIG. 1, there is shown a graph illustrating the forward current gain (beta) characteristic of a standard bipolar transistor versus its collector current. Curve 10 corresponds to the characteristics of a non-degraded transistor while curve 12 shows the characteristics of the transistor after is has been degraded. For example, comparing curve 12 to curve 10 shows that the beta of the transistor has been decreased by approximately fifty percent, at a collector current of ten microamperes. The phenononom by which the beta of the transistor is degraded is well known. The bipolar transistor beta is degraded by forcing sufficient current through its reverse biased emitter-base junction for a short time interval. In the present case a current of approximately ten milliamperes was forced through the emitter-base junction of the transistor for ten milliseconds. The beta degradation is accompanied by a shift in the $V_{BE}$, the base-emitter voltage, of the transistor over a range of low emitter (collector) currents. This means that for a given value of $V_{BE}$, the degraded transistor will conduct less collector (emitter) current than a non-degraded, matched transistor. Also, for a given base current, the degraded transistor will conduct less emitter current than a matched, non-degraded transistor. The foregoing description does not consider other factors such as thermal and mechanical stresses which, in any event, should effect both a non-degraded and degraded beta transistor in an equal manner. Hence, the differential beta degradation between the two transistors will remain substantially the same notwithstanding these other factors.

The above described phenonomen is utilized in the present invention for providing programmable non-volatile bipolar memory cells as will hereinafter be described in detail. In general, the method of providing a bipolar memory circuit employs comparing the $V_{BE}$ or beta of a selected degraded transistor to a non-degraded (reference) transistor.

Figure 2:
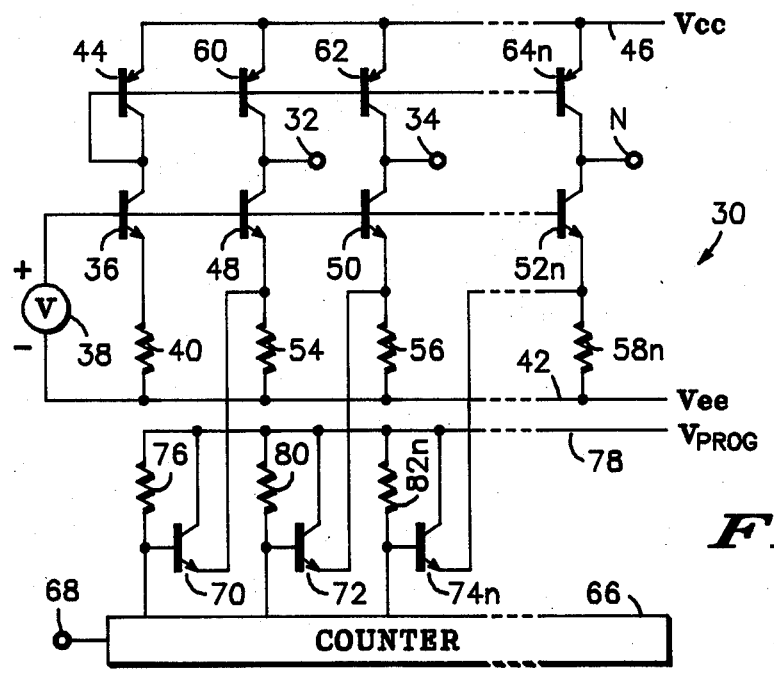
FIG. 2 is a schematic diagram illustrating a memory cell using the techniques of one embodiment of the invention.

Referring now to FIG. 2, there is shown bipolar memory circuit 30 of a first embodiment of the invention. Memory circuit 30 is a N-bit circuit having logic outputs 32, 34 through N where N is a positive integer. A reference, non-degraded NPN transistor 36 is biased by a low output impedance voltage source 38 supplied to its base. The emitter of transistor 36 is coupled via resistor 40 to power supply conductor 42 to which is supplied the reference potential $V_{ee}$. The collector of transistor 36 is coupled to the interconnected base and collector of PNP transistor 44, the latter supplying collector current to the former. The emitter of transistor 44 is coupled to power supply conductor 46 to which is supplied operating potential $V_{cc}$. A plurality of NPN transistors 48, 50, through 52n, the collectors of which are coupled to corresponding logic outputs 32, 34 through N of memory circuit 30, are provided having their base electrodes coupled to the base of reference transistor 36. The emitters of transistors 48, 50, 52n are connected to power supply conductor 42 through respective resistors 54, 56 and 58n. The collectors of transistors 48, 50 through 52n are also connected respectively to the collectors of PNP current sourcing transistors 60, 62 through 64n, the emitters of the latter being coupled to power supply conductor 46. The bases of transistors 60, 62 through 64n are coupled to the base of transistor 44.

Logic outputs 32, 34 through N are initially at a low logic or zero state assuming the collector current of reference transistor 36, supplied by transistor 44, is mirrored equally by the matched current sourcing transistors 60, 62 and 64n and the emitter areas of transistors 48, 50 and 52n and/or the resistors 54, 56 and 58n are such that the NPN output transistors are each biased to sink more collector current than is supplied by the respective PNP current sourcing transistor connected therewith. In this state, each one of the transistors 48, 50 through 52n is in a saturated condition which sets the logic outputs 32, 34 through N to the low logic or zero output state. It is recognized that the collectors of each of the transistors 48, 50 through 52n may be clamped to a first predetermined voltage to prevent saturation thereof and, further, to a second predetermined voltage to prevent the rise in voltage at outputs 32, 34 through N from causing the current sourcing transistors to saturate when the former are degraded. Thus, any circuit unbalanced that may otherwise result due to saturating transistors is prevented.

The logic output state of any output or all of the logic outputs can be changed to a high output logic state or a logic "1" by selectively degrading the $V_{BE}$ of transistors 48, 50 through 52n by beta degradation using the above described phenonomen. Hence, by degrading the beta (and therefore $V_{BE}$) of one or more of the transistors, for example transistor 48, the transistor will sink less current than before with the same bias voltage V applied across its base to emitter. Hence, not all of the current sourced to transistor 40 from current source transistor 60 is conducted through the former and it is no longer in saturated condition. Since, selected transistor 48 is no longer in a saturated condition the associated logic output will go to a high logic state. Thus, the conducting state of the selected degraded transistor is compared to its conducting state prior to being degraded with respect to reference transistor 36 to produce the change in the output signal logic state.

The $V_{BE}$ of any or all of the NPN transistors are selectively degraded by Zenering the emitter-base junction of the selected transistor with sufficient current in the following manner. A counter 66 may be used to receive serial digital input signals at input 68. Thus, serial 1's and 0's are supplied to counter 66 which puts the desired output thereof onto the bases of programming transistors 70, 72 through 74n. If, for instance, transistor 48 is to be degraded, to produce a logic one at output 32, the output of counter 66 that is connected to the base of transistor 70 is open circuited to permit base current drive to be supplied to the base of the transistor via resistor 76 which is connected to supply rail 78. Rail 76 receives programing voltage, $V_{Prog}$, supplied thereto. Current is then sourced through transistor 70 and the reverse biased emitter-base junction of transistor 48 to power supply 38 for a sufficient time to degrade the latters $V_{BE}$. Similarly, transistors 50 thrugh 52n can be selectively programmed by sourcing current in the reverse direction as base drive is supplied through respective resistors 80 through 82n and transistors 72 through 74n.

Memory cell 30 is fabricated using conventional bipolar integrated circuit processes and can be programmed permanently to produced desired logic outputs by comparing a selectively degraded NPN transistor's $V_{BE}$ with the $V_{BE}$ of a non-degraded transistor. The memory circuit is programmed using a relatively low programming current (1-10 milliamperes) when compared to conventional methods presently utilized.

Figure 3:
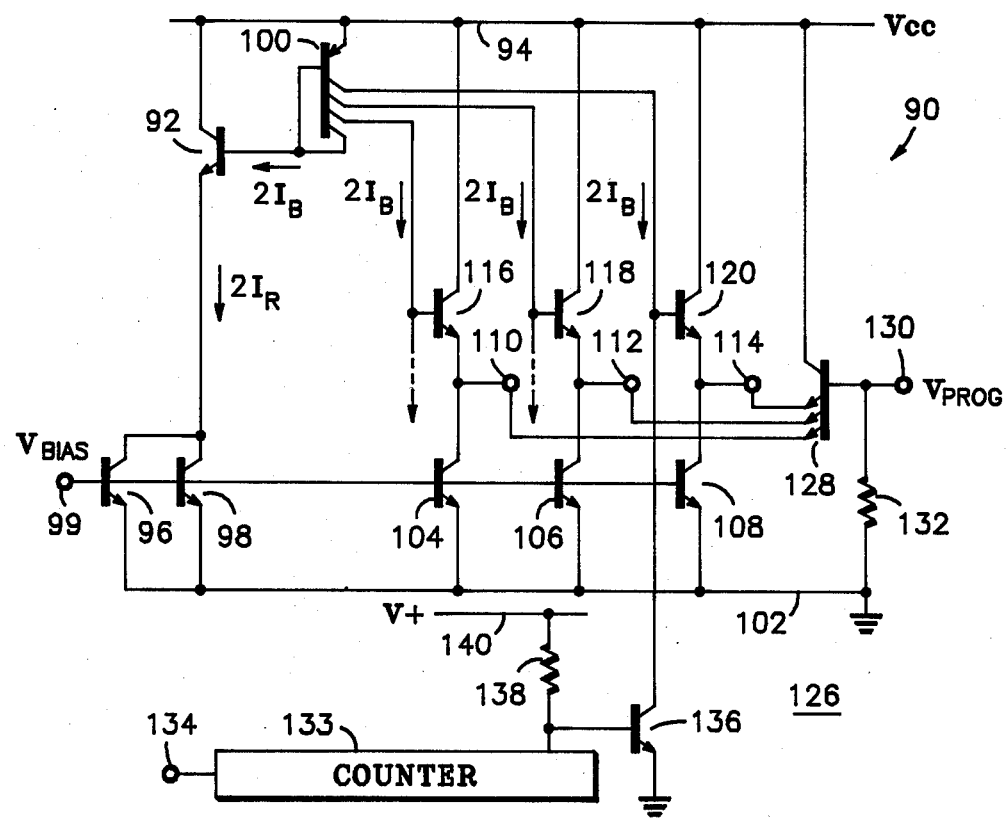
FIG. 3 is a schematic diagram illustrating a memory cell of a second embodiment of the invention.

Turning now to FIG. 3 there is illustrated bipolar memory cell 90 of another embodiment of the invention wherein the beta of a non-degraded reference transistor 92 is compared with one or more degraded beta transistors as will be described. Memory circuit 90 is shown as a 3 bit programmable memory although it is understood that any number of output logic states can be provided using the method of the present invention. Memory 90 includes NPN reference transistor 92 having its collector-emitter conduction path coupled between positive supply rail 94 and the collectors of NPN transistors 96 and 98. Transistor 92 is supplied base current drive from multi-collector PNP transistor 100 which has its emitter coupled to positive rail 94 and one of its collectors connected with its base to source base current drive to reference transistor 92. A plurality of current sinking NPN transistors 104, 106 and 108, which are matched devices with transistors 96 and 98, have their bases coupled to the bases of the latter to terminal 99 to which a bias potential $V_{BIAS}$ is supplied. The collector-emitter conduction path of each current sinking transistor is coupled between a respective logic output 110, 112, and 114 of memory 90 and negative supply rail 102. A plurality of current sourcing transistors 116, 118, and 120 each having their collector-emitter conduction paths coupled between rail 94 and the collector of a respective one of the current sinking transistors are supplied base current drive from transistor 100 as the base electrodes of the current sourcing transistors are coupled to a respective collector of the latter device.

Transistor 100 functions as a current mirror to supply equal currents from each collector equal to $2I_B$. Reference transistor 92 will supply an emitter current of $2I_R$ which is taken by transistors 96 and 98. Since current sinking transistors 96 and 98 are matched each will sink a current of $I_R$. Because each of the current sinking transistors 104, 106 and 108 are biased in the same manner as transistors 96 and 98 and are matched therewith, each will want to sink a current of $I_R$ at their respective collectors.

Assuming initially that each of the current sourcing transistors 116, 118 and 120 are matched to reference transistor 92, each will source a current of value $2I_R$ therefrom with the base current supplied thereto being equal to $2I_B$. Hence, an excess current is available at each of the logic outputs 110, 112 and 114 since transistors 104, 106 and 108 can not sink all of the emitter current sourced from respective transistors 116, 118 and 120. Thus, a logic one output state is produced at each of the logic outputs 116, 118 and 120. By selectively degrading the beta (low current gain) of each of the transistors 116, 118, and 120 the logic output state at outputs 110, 112 and 114 can be programmed to a logic "zero" accordingly.

Programming circuit 126 provides a means for selectively degrading any one or all of the logic transistors 116, 118, and 120 as will now be described. Programming circuit 126 comprises multi-emitter NPN transistor 128 the collector of which is coupled to positive rail 94 and whose base receives a program bias potential $V_{Prog}$ at terminal 130. A bias resistor 132 is connected between the base of transistor 128 and negative rail 102. As illustrated, each emitter of transistor 128 is connected to a respective emitter of one of the logic output transistors 116, 118 and 120. A serial counter 133, which receives serial digital data at input 134 is utilized to turn programming transistor 136 on or off accordingly as base current is supplied via resistor 138. The current that is sourced through resistor 138 from rail 140 will either be sourced to the base of transistor 136 thereby turning it on or will be sunk at a respective output of counter 132. It is understood that the bases of transistors 116 and 118 are connected to the collectors of programming transistors similarly to transistor 136 as indicated by the dashed lines.

If, for example, the transistor 120 is selected to have its beta degraded to produce a logic zero output at terminal 114 as described above, the output of counter 133 which is connected to the base of transistor 136 is open-circuited in response to the digital input data supplied at input 134. Simultaneously, the base of transistor 128, which is normally off, is supplied the potential $V_{Prog}$ which renders the transistor conductive. Since, transistor 136 is supplied with base current drive it turns on to lower the potential at the base of transistor 120. The emitter of transistor 120 is at the same potential as the emitter of transistor 128. Thus, current is sourced from the emitter of transistor 128 through the emitter-base of transistor 120 and the low-impedance collector-emitter path of transistor 136. If transistors 116 and 118 are not selected to be degraded, the associated programming transistors are maintained in an off state to prevent current flow from the respective emitters of transistor 128 through the emitter-base junctions thereof.

Assuming transistor 120 has had its low current gain, beta, degraded in the above described manner, the collector/emitter current will be less with the same base current, $2I_B$, supplied thereto. For example, if beta of transistor 120 is reduced by greater than fifty percent, it will now source a current at its emitter less than $I_R$. Thus, transistor 108 can now sink all of the current sourced from the emitter of transistor 120 such that logic output terminal 114 is placed at a low logic level.

The circuit means for selective degrading the logic state producing transistors of FIGS. 2 and 3 may also be utilized to dynamically test the logic circuit path between the transistors and the outputs of the memory cells. Hence, in FIG. 2, the normal logic output signal state appearing at outputs 32, 34 through N can be switched to test circuit operation by reducing $V_{PROG}$ during a test mode to a value insufficient to cause degradation of the selected transistor 34, 34 through N while turning on the corresponding one of the transistors 70, 72 through 74n. For example, a logic "1" would be placed at the output of counter 66 during test to permit transistor 74n to be turned on. If $V_{PROG}$ is reduced during the test mode, transistor 74n will source current through resistor 58n to cause transistor 52n to be biased off. This will cause the logic state at output N coupled to transistors 52n and 64n to switch states to thereby confirm operation of the logic circuit path. Likewise, the logic path between transistor 116, 118 and 120 and associated outputs 110, 112, and 114 coupled thereto (FIG. 3) can be tested by selectively turning on the transistors comprising programming means 126, i.e., transistor 136 and its counterparts while reducing the magnitude of $V_{PROG}$. Thus, as transistor 120 is turned off in response to turning on transistor 136, the logic state at output 114 switches from a high level to a low level. This permits test of the circuit path between transistor 120 and output 114. Similarly, the circuit path can be tested between transistors 116 and 118 and their respective outputs 110 and 112.

It is understood that although current sourcing transistors 44, 60, 62 through 64n are illustrated in FIG. 2 as being discretely formed in the integrated circuit a single multi-collector transistor could provide the same function in the same manner as multi-collector transistor 100 (FIG. 3). Conversely, multi-collector transistor 100 can be realized by individual PNP current sourcing transistors similar to transistors 44, 60, 62 through 64n (FIG. 2).

Hence, what has been described above are novel apparatus and method for providing programmable bipolar memory cells using low programming current. This allows in package programming of a large array of bipolar integrated memory cells.

What is claimed is:

1. In a bipolar programmable memory cell including a reference transistor having predetermined low current gain and base-to-emitter voltage characteristics associated therewith and an additional transistor which has matched characteristics with respect to the reference transistor, a method for programming the memory cell output to a desired logic state comprising the steps of:
   selectively non-destructively degrading the low current gain and/or base-to-emitter voltage characteristics of the additional transistor; and
   comparing such degraded characteristics of the degraded transistor with the characteristics of the reference transistor to produce the desired logic state at an output of the memory cell.

2. A bipolar memory circuit having at least one output at which is provided a logic output signal the state of which can be programmed, comprising:
   a reference transistor having certain low current gain and base-to-emitter voltage characteristics associated therewith;
   at least one additional transistor coupled to the output of the memory cell and having certain low current gain and base-to-emitter voltage characteristics which are initially substantially equal to the same of said reference transistor, said at least one additional transistor producing an output signal of a first logic state at the output;
   means coupled to said at least one additional transistor for selectively non-destructively degrading said characteristics of predetermined ones of said additional transistor with respect to said characteristics of said reference transistor; and
   means for comparing said degraded additional transistor's characteristics with said reference transistor's characteristics to produce a change in the logic state of the output signal.

3. The memory circuit of claim 2 including:
   a plurality of additional transistors each coupled to a respective one of a plurality of outputs of the memory circuit:
   said means for selectively degrading said additional transistor being coupled to said plurality of additional transistors for selectively degrading the low current gain and/or base-to-emitter voltage characteristics thereof wherein the logic states appearing at said respective outputs are selectively changed.

4. The memory circuit of claim 3 including:
   current source means for sourcing substantially equal currents to the respective collector-emitter conduction paths of said reference transistor, said at least one additional transistor and said plurality of additional transistors; and
   low impedance voltage source means for providing a bias potential across the base-emitter junctions of said reference transistor, said at least one additional transistor and said plurality of additional transistors.

5. The memory circuit of claim 3 including:
   current source means for supplying substantially equal currents at outputs thereof, said outputs being coupled respectively to the bases of said reference transistor, said at least one additional transistor and said plurality of additional transistors;
   first and second matched transistor having their respective collector-emitter conduction paths connected in series with the collector-emitter conduction path of said reference transistor between first and second power supply conductors, the bases of said first and second transistors being coupled to a terminal at which a bias potential is supplied; and a plurality of bias transistors each being matched to said first and second transistors and having their bases coupled to said terminal and collector-emitter conduction paths connected in series with the collector-emitter path of a respective one of said at least one additional transistor and said plurality of additional transistors between said first and second power supply conductors.

6. A bipolar memory cell, comprising:

a reference transistor having a base, an emitter and a collector, said reference transistor having a predetermined low current gain characteristic;

a plurality of transistors each having a base, an emitter and a collector, said bases being coupled to the base of said reference transistor, said emitters being coupled with the emitter of said reference transistor, said collectors being coupled to respective outputs of the memory cell, each of said plurality of transistors having substantially equal low current gain characteristics with respect to said reference transistor;

current source means for sourcing equal currents at outputs thereof, said outputs being respectively coupled to said collector of said reference transistor and said collectors of said plurality of transistors;

voltage source means for supplying a low impedance potential between said base and emitter of said reference transistor; and means for selectively non-destructively degrading the low current gain characteristics of said plurality of transistors.

7. The memory circuit of claim 6 wherein said current source means includes:

a first transistor having its base and collector interconnected to said collector of said reference transistor and its emitter coupled to a first power supply conductor; and a plurality of transistors each having a base coupled to said base of said first transistor, an emitter coupled to said first power supply conductor and a collector coupled to a respective output of said current source means.

8. A bipolar memory cell having a plurality of outputs at which appear respective logic output signals, comprising:

a reference transistor having a collector coupled to a power supply conductor and having a predetermined low current gain characteristic associated therewith;

a plurality of output transistors each having respective collector-emitter conduction paths coupled between said power supply conductor and a respective one of the outputs of the memory cell, each of said output transistors having substantially the same low current gain characteristics as said reference transistor;

current source means for providing substantially equal currents to the bases of said reference transistor and said plurality of output transistors;

circuit means for sinking predetermined currents from said reference transistor and said plurality of output transistors wherein logic output signals of a first logic level are produced at the outputs of the memory circuit; and means for non-destructively degrading the low current gain characteristic of selected ones of said plurality of output transistors to cause the logic output signal at the associated output to be changed from said first level to a second level.

9. The memory circuit of claim 8 wherein said circuit means includes:

first and second transistors each having a collector coupled to the emitter of said reference transistor, an emitter coupled to a second power supply conductor and a base to which is supplied a bias potential; and a plurality of current sinking transistors each having a collector coupled to an emitter of a respective one of said plurality of output transistors, an emitter coupled to said second power supply conductor and a base coupled to said bases of said first and second transistors, each of said plurality of output transistors having matched characteristics with respect to said first and second transistors to therefore sink substantially the same magnitude of current.

10. The memory circuit of claim 9 wherein said current source means includes a multi-collector transistor the base and one collector of which are connected to said base of said reference transistor, the emitter being coupled to said first power supply conductor and respective ones of the other collectors being coupled to said bases respectively of said plurality of output transistors.

11. A bipolar memory cell for providing at least one output at which a logic output signal is provided wherein the logic state thereof can be programmed, comprising:

a reference transistor having low current characteristics associated therewith;

means for sourcing operating current to said reference transistor;

an additional transistor initially having substantially identical low current characteristics as said reference transistor, said additional transistor being coupled to the output of the memory cell;

circuit means coupled to said additional transistors which is responsive to a program voltage of a first magnitude for causing the logic output signal to switch logic states and being responsive to said progam voltage having a second magnitude for selectively non-destructively degrading said low current characteristics of said additional transistor; and means for comparing said reference transistor with said additional to produce a change in said logic output signal responsive to said additional transistor having its low current characteristics degraded.

* * * * *